United States Patent
Feng

(10) Patent No.: US 11,924,973 B2
(45) Date of Patent: Mar. 5, 2024

(54) CLAMPING MECHANISM AND TRANSFERRING APPARATUS

(71) Applicant: TRIPLE WIN TECHNOLOGY(SHENZHEN) CO. LTD., Shenzhen (CN)

(72) Inventor: Chao Feng, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 889 days.

(21) Appl. No.: 16/941,798

(22) Filed: Jul. 29, 2020

(65) Prior Publication Data

US 2021/0100142 A1    Apr. 1, 2021

(30) Foreign Application Priority Data

Sep. 29, 2019 (CN) .......................... 201921653210.5

(51) Int. Cl.
*H05K 13/00* (2006.01)
*B66C 1/66* (2006.01)

(52) U.S. Cl.
CPC ............................... *H05K 13/0069* (2013.01)

(58) Field of Classification Search
CPC .......... H05K 13/0069; B66C 1/66; B66C 1/42
USPC .............................................. 294/119.1, 215
See application file for complete search history.

(56) References Cited

U.S. PATENT DOCUMENTS

| | | | | |
|---|---|---|---|---|
| 4,600,231 A * | 7/1986 | Sickles | ............... | H05K 13/0069 206/707 |
| 4,653,794 A * | 3/1987 | Atlas | .................... | B25J 15/0253 294/207 |
| 4,657,146 A * | 4/1987 | Walters | .............. | H05K 13/0069 361/801 |
| 5,167,482 A * | 12/1992 | Cross | ............... | H01B 13/01236 294/99.1 |
| 5,638,958 A * | 6/1997 | Sanchez | .............. | H01L 21/6732 211/41.12 |
| 6,606,248 B2 * | 8/2003 | Matthews | ......... | H01L 21/67346 361/752 |
| 6,607,227 B1 * | 8/2003 | Morton | ................... | H01R 43/20 294/119.1 |
| 7,322,623 B2 * | 1/2008 | Morton | .................. | H01R 43/20 294/902 |
| 7,559,730 B2 * | 7/2009 | Song | .................... | H01L 21/6734 414/217 |
| 8,172,292 B1 * | 5/2012 | Andersen | .............. | B65B 25/046 294/2 |

(Continued)

*Primary Examiner* — Paul T Chin
(74) *Attorney, Agent, or Firm* — ScienBiziP, P.C.

(57) ABSTRACT

A clamping mechanism providing automatically accurate placement includes a pillar, a first clamping plate fixed to a first end of the pillar, and a second clamping plate movably coupled to a second end of the pillar and opposite to the first clamping plate. The first clamping plate includes a base plate. The base plate includes a first surface facing the second clamping plate and two opposite side faces connected to the first surface. The first surface is concave and defines two first positioning slots on opposite sides. Each first positioning slot passes through the two side faces. The first positioning slots are configured to position a carrying frame on a transferring apparatus accurately. A transferring apparatus including the clamping mechanism is also disclosed.

13 Claims, 4 Drawing Sheets

(56) References Cited

U.S. PATENT DOCUMENTS 10,440,870 B1 * 10/2019 Solanki .............. H05K 13/0408
11,292,140 B2 * 4/2022 Motowaki .............. B25J 15/026

* cited by examiner

CLAMPING MECHANISM AND TRANSFERRING APPARATUS

FIELD

The subject matter herein generally relates to industrial handling.

BACKGROUND

In a process of manufacturing circuit boards, a transferring apparatus can transfer a frame carrying the circuit boards to a predetermined position. However, if the frame is not positioned on the transferring apparatus accurately, the progress and quality of the circuit board are affected.

BRIEF DESCRIPTION OF THE DRAWINGS

Implementations of the present technology will now be described, by way of embodiment, with reference to the attached figures.

DETAILED DESCRIPTION

Figure 1:
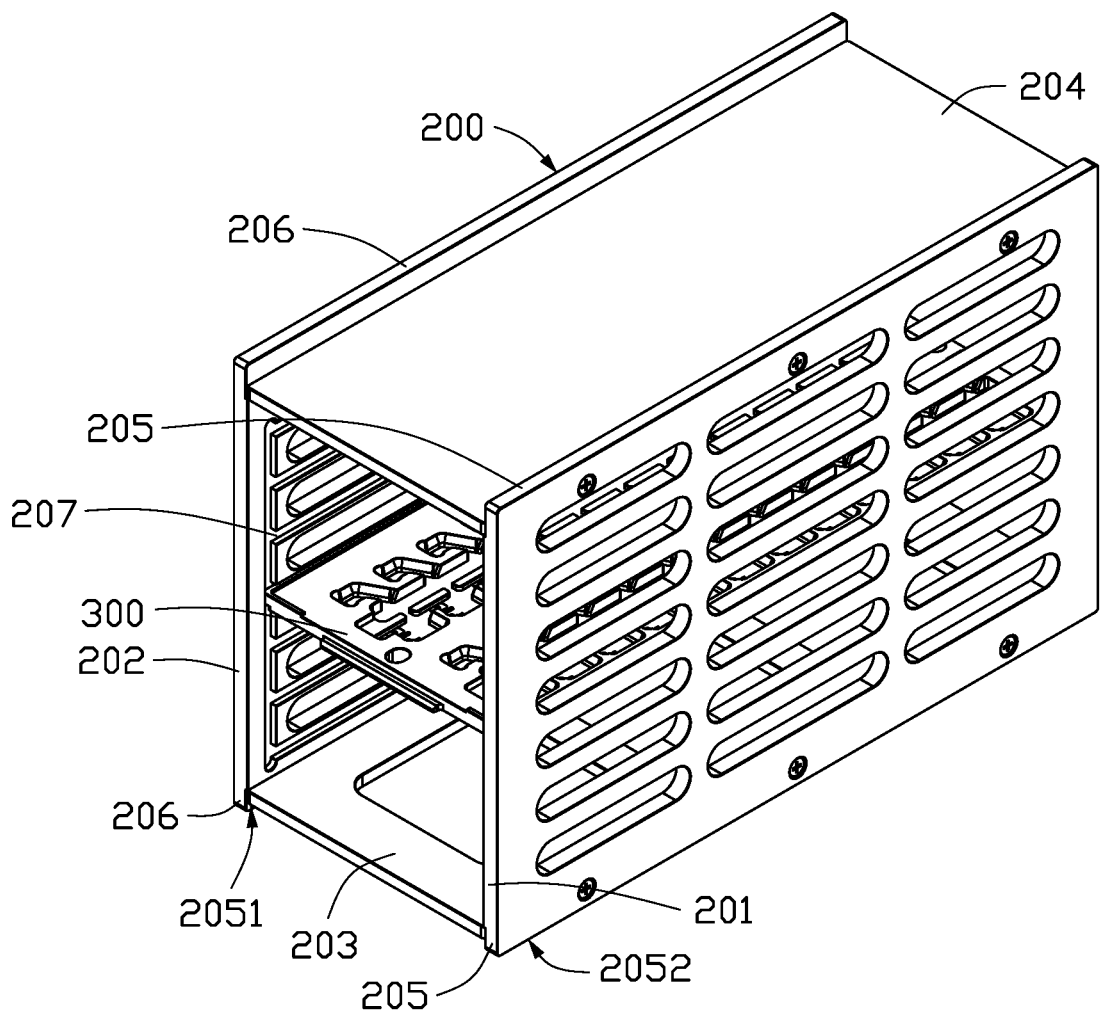
FIG. 1 is a schematic view of an embodiment of a carrying frame.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

FIG. 1 illustrates an embodiment of a carrying frame 200. The carrying frame 200 is configured for carrying workpieces 300 and is configured to be clamped and transferred by a transferring apparatus. The carrying frame 200 includes a first side wall 201, a second side wall 202 opposite to the first side wall 201, a bottom plate 203 connecting the first side wall 201 and the second side wall 202, and a top plate 204 connecting the first side wall 201 and the second side wall 202 and being opposite to the bottom plate 203. Each of the top plate 204 and the bottom plate 203 is substantially perpendicularly to the first side wall 201 and the second side wall 202. A first end of the first side wall 201 adjacent to bottom plate 203 protrudes beyond the bottom plate 203 to form a first positioning portion 205. In an alternative embodiment, a second end of the first side wall 201 adjacent to the top plate 204 protrudes beyond the top plate 204 to form a first positioning portion 205. The second side wall 202 defines a second positioning portion 206 corresponding in position to the first positioning portion 205. The first positioning portion 205 and the second positioning portion 206 are configured to position the carrying frame 200 to a clamping mechanism. In one embodiment, the workpieces are circuit boards.

Each of the first positioning portion 205 and the second positioning portion 206 includes an inner surface 2051 and an outer surface 2052 coupled to the inner surface 2051. The two inner surfaces 2051 of the first and second positioning portions 205 and 206 are opposite to each other. The outer surface 2052 of the first positioning portion 205 is aligned with the outer surface 2052 of the second positioning portion 206.

Each of the first side wall 201 and the second side wall 202 defines a plurality of sliding slots 207, extending from a side to an opposite side of the first/second side wall, on the inner surface 2051. The sliding slots 207 on the first side wall 201 are spaced along a height direction of the first side wall 201. The sliding slots 207 on the second side wall 202 are spaced along a height direction of the second side wall 202. Two opposite edges of a workpiece 300 are received in two sliding slots 207 of the first side wall 201 and the second side wall 202. The workpiece 300 can enter or exit the carrying frame 200 in the extending direction of the sliding slot 207.

Figure 2:
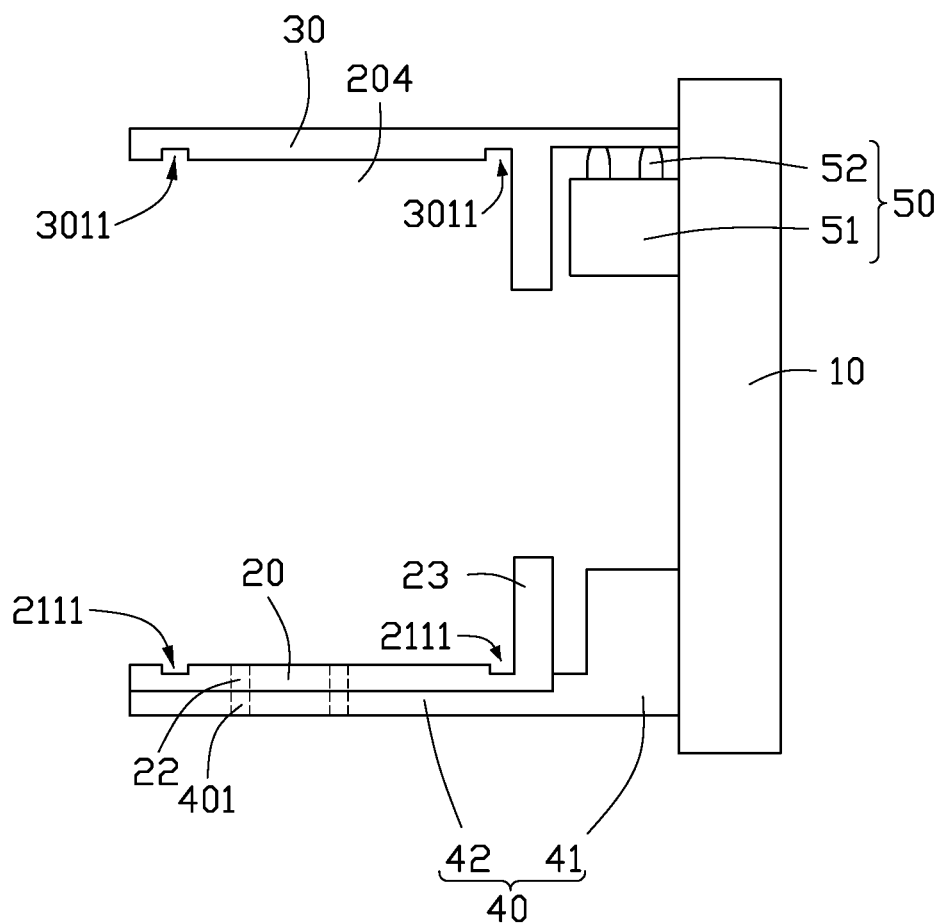
FIG. 2 is a schematic view of an embodiment of a clamping mechanism.
Figure 3:
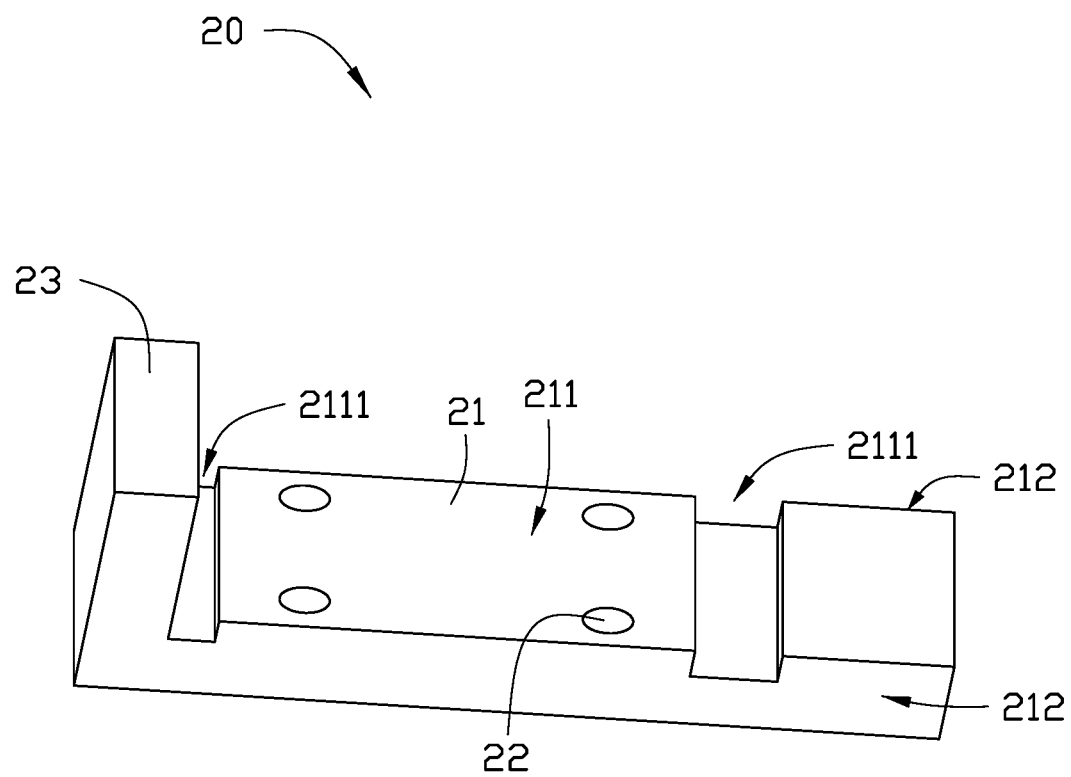
FIG. 3 is an isometric view of a first clamping plate of the clamping mechanism of FIG. 2.

FIGS. 2 and 3 illustrate an embodiment of a clamping mechanism 100 for clamping the carrying frame 200. The clamping mechanism 100 includes a pillar 10, a first clamping plate 20, and a second clamping plate 30. The first clamping plate 20 is fixed to a first end of the pillar 10, and the second clamping plate 30 is opposite to the first clamping plate 20 and is movably coupled to a second end of the pillar 10.

The first clamping plate 20 includes a base plate 21. The base plate 21 includes a first surface 211 facing the second clamping plate 30 and two side faces 212 connected to the first surface 211. The two side faces 212 are opposite to each other. The first surface 211 is concave, and defines two first positioning slots 2111 on opposite sides. The first positioning slot 2111 passes through the two side faces 212 and is configured for fixing the carrying frame 200.

When in use, the second clamping plate 30 is first arranged far from the first clamping plate 20, and then the carrying frame 200 carrying the workpieces 300 is transported onto the first clamping plate 20. The first positioning portion 205 and the second positioning portion 206 are received in the two first positioning slots 211, thus positioning the carrying frame 200 on the first clamping plate 20 accurately. The second clamping plate 30 then moves towards the first clamping plate 20 until the carrying frame 200 is clamped by the first clamping plate 20 and the second clamping plate 30. The clamping mechanism 100 thus completes one clamping operation.

The first clamping plate 20 further includes a baffle 23. The baffle 23 is arranged on the base plate 21 and substantially perpendicularly extends towards the second clamping plate 30. The baffle 23 is adjacent to a side of one first positioning slot 211 away from another first positioning slot 211. In one embodiment, the baffle 23 extends from the side of one first positioning slot 211 away from the other first positioning slot 211 and towards second clamping plate 30. The baffle 23 blocks the carrying frame 200 and prevents the first positioning portion 205 or the second positioning portion 206 from slipping out of the first positioning slot 211. In one embodiment, when the first positioning portion 205 or the second positioning portion 206 is received in the first positioning slot 2111, a side of the baffle 23 adjoins an outer surface of the first side wall 201, thus when the carrying frame 200 is shaken or is pushed, the baffle 23 directly blocks the movement of the carrying frame 200.

The baffle 23 extends along an extending direction of the first positioning slot 211, thus the baffle 23 prevents the first positioning portion 205 or the second positioning portion 206 from slipping further out of the first positioning slot 211.

The clamping mechanism 100 further includes a support element 40. The support element 40 is substantially L shaped. The support element includes a fixing portion 41 and a support portion 42 which is perpendicular to and connected to the fixing portion 41. The fixing portion 41 is fixed on the pillar 10. The first clamping plate 20 is fixed on a side of the support portion 42 facing the second clamping plate 30.

The base plate 21 further includes a second surface 213 opposite to the first surface 211. The second surface 213 adjoins the support element 40. The base plate 21 defines a plurality of first fixing holes 22 through the first surface 211 and the second surface 213. The support element 40 defines a plurality of second fixing holes 401 corresponding in position to the first fixing holes 22. The inner walls of the first and second fixing holes 22 and 401 define threads, a fastener (e.g. a bolt) 70 passes through the first fixing hole 22 and screws into the second fixing hole 401 to fix the first clamping plate 20 on the support element 40.

A structure of the second clamping plate 30 is similar to a structure of the first clamping plate 20. The second clamping plate 30 includes a third surface 301 facing the first surface 211. The third surface 301 is concave and defines two second positioning slots 3011 corresponding in positions to the first positioning slots 2111. The second positioning slots 3011 are configured to fix the carrying frame 200 from a side away from the first positioning slots 2111.

When the first and second positioning portions 205 and 206 adjacent to the bottom plate 203 are received in the two first positioning slots 2111, the first and second positioning portions 205 and 206 adjacent to the top plate 204 are received in the two second positioning slots 3011, thus positioning the carrying frame 200 on the clamping mechanism 100 accurately.

The clamping mechanism 100 further includes a cylinder 50. The cylinder 50 includes a base body 51 and a movable push rod 52 extending out of base body 51. The base body 51 is fixed to an end of the pillar 10 away from the first clamping plate 20, and the push rod 52 is coupled to the third surface 301 of the second clamping plate 30, thereby the second clamping 30 is movably fixed to the pillar 10.

Figure 4:
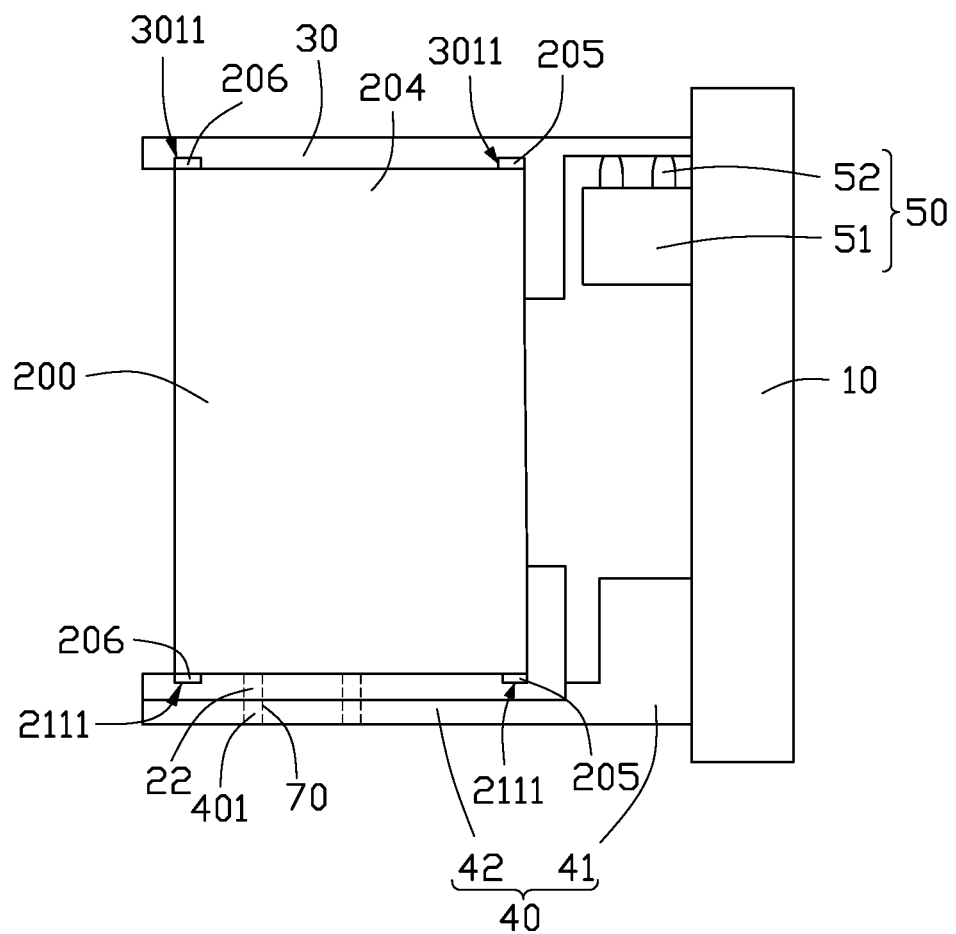
FIG. 4 is a schematic view of an embodiment of a transferring apparatus.

FIG. 4 illustrates an embodiment of a transferring apparatus 400. The transferring apparatus 400 includes the carrying frame 200 and the clamping mechanism 100. The first positioning portion 205 is received in the first positioning slot 2111 of the clamping mechanism 100, and the second positioning portion 205 is received in the second positioning slot 3011 of the clamping mechanism 100.

The transferring apparatus 400 further includes a driving mechanism (not shown), the driving mechanism drives the clamping mechanism to clamp and move the carrying frame 200.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A clamping mechanism comprising:
a pillar;
a first clamping plate fixed to an end of the pillar;
a second clamping plate movably coupled to an end of the pillar and opposite to the first clamping plate; and
a support member fixed on the pillar;
wherein the first clamping plate comprises a base plate, the base plate comprises a first surface facing the second clamping plate, a second surface opposite to the first surface and adjoining the support element, and two opposite side faces each connected to the first surface, the first surface defines two first positioning slots on opposite sides, each of the two first positioning slots extends through the two side faces;
the base plate defines a first fixing hole extending through each of the first surface and the second surface, the support element defines a second fixing hole corresponding in position to the first fixing hole, a fastener extends through the first fixing hole and screws into the second fixing hole to fix the first clamping plate on the support element.

2. The clamping mechanism of claim 1, wherein the first clamping plate further comprises a baffle arranged on the base plate and extending towards the second clamping plate, the baffle is adjacent to a side of first one of the two first positioning slots away from a second one of the two first positioning slots.

3. The clamping mechanism of claim 2, wherein the baffle extends along an extending direction of the first one of the two first positioning slots.

4. The clamping mechanism of claim 1, wherein the support element comprises a fixing portion and a support portion which is perpendicular to and connected to the fixing portion, the fixing portion is fixed on the pillar, the first clamping plate is fixed on a side of the support portion facing the second clamping plate.

5. The clamping mechanism of claim 1, wherein the second clamping plate comprises a third surface facing the first surface, the third surface defines two second positioning slots corresponding in position to the two first positioning slots respectively.

6. The clamping mechanism of claim 1, wherein the clamping mechanism further comprises a cylinder, the cylinder comprises a base body and a movable push rod extending out of the base body, the base body is fixed to an end of the pillar away from the first clamping plate, and the push rod is coupled to the third surface of the second clamping plate.

7. A transferring apparatus comprising:
a clamping mechanism, the clamping mechanism comprising:

a pillar,
a first clamping plate fixed to an end of the pillar, and
a second clamping plate movably coupled to an end of the pillar and opposite to the first clamping plate; and
a carrying frame comprising a first side wall, a second side wall opposite to the first side wall, a bottom plate connecting the first and the second side walls, and a top plate connecting each of the first and the second side walls and being opposite to the bottom plate;
wherein the first clamping plate comprises a base plate, the base plate comprises a first surface facing the second clamping plate and two opposite side faces each connected to the first surface, the first surface defines two first positioning slots on opposite sides, each of the two first positioning slots extends through the two side faces;
wherein the first side wall defines a first positioning portion protruding out of the bottom plate, the second side wall defines a second positioning portion protruding out of the bottom plate, the first and the second positioning portions protruding out of the bottom plate are respectively received in the two first positioning slots.

8. The transferring apparatus of claim 7, the first clamping plate further comprises a baffle arranged on the base plate and extending towards the second clamping plate, the baffle is adjacent to a side of a first one of the two first positioning slots away from a second one of the two first positioning slots.

9. The transferring apparatus of claim 8, wherein the baffle extends along an extending direction of the first one of the two first positioning slots.

10. The transferring apparatus of claim 7, wherein the clamping mechanism further comprises a support element, the support element comprises a fixing portion and a support portion which is perpendicular to and connected to the fixing portion, the fixing portion is fixed on the pillar, the first clamping plate is fixed on a side of the support portion facing the second clamping plate.

11. The transferring apparatus of claim 10, wherein the base plate further comprises a second surface opposite to the first surface and adjoining the support element, the base plate further defines a first fixing hole extending through the first surface and the second surface, the support element defines a second fixing hole corresponding in position to the first fixing hole, a fastener extends through the first fixing hole and screws into the second fixing hole to fix the first clamping plate on the support element.

12. The transferring apparatus of claim 7, wherein the second clamping plate comprises a third surface facing the first surface, the third surface defines two second positioning slots corresponding in position to the two first positioning slots respectively, the first side wall defines a first positioning portion protruding out of the top plate, the second side wall defines a second positioning portion protruding out of the top plate, the first and the second positioning portions protruding out of the top plate are respectively received in the two second positioning slots.

13. The transferring apparatus of claim 7, wherein the clamping mechanism further comprises a cylinder, the cylinder comprises a base body and a movable push rod extending out of the base body, the base body is fixed to an end of the pillar away from the first clamping plate, and the push rod is coupled to the third surface of the second clamping plate.

\* \* \* \* \*